United States Patent

LaFontaine et al.

[11] Patent Number: 5,838,012
[45] Date of Patent: Nov. 17, 1998

[54] CHARGE EXCHANGE CELL

[75] Inventors: Marvin LaFontaine, Kingston, N.H.; Nobuhiro Tokoro, West Newbury, Mass.; Victor Quattrini, Haverhill, Mass.; Daniel Bissonnette, Leominster, Mass.; Takao Sakase, North Reading, Mass.

[73] Assignee: Genus, Inc., Sunnyvale, Calif.

[21] Appl. No.: 822,543

[22] Filed: Mar. 19, 1997

[51] Int. Cl.$^6$ .................................................. H01J 27/00
[52] U.S. Cl. ........................................................ 250/423 R
[58] Field of Search .............................. 250/423 R, 251

[56] References Cited

U.S. PATENT DOCUMENTS

| | | | |
|---|---|---|---|
| 2,232,030 | 2/1941 | Kallmann | 250/423 R |
| 3,395,302 | 7/1968 | Brown, Jr. et al. | 313/34 |
| 3,617,789 | 11/1971 | Middleton | 250/423 R |
| 3,890,535 | 6/1975 | Gautherin et al. | 250/423 R |
| 4,616,157 | 10/1986 | Naylor et al. | 315/111.01 |
| 4,712,012 | 12/1987 | Naylor | 250/423 R |
| 4,724,117 | 2/1988 | Stearns et al. | 376/129 |
| 4,980,556 | 12/1990 | O'Connor et al. | 250/423 R |
| 5,049,739 | 9/1991 | Okamoto | 250/281 |
| 5,300,891 | 4/1994 | Tokoro | 250/251 |
| 5,543,615 | 8/1996 | Saito et al. | 250/251 |
| 5,670,785 | 9/1997 | Kitamura | 250/423 R |

*Primary Examiner*—Bruce Anderson
*Attorney, Agent, or Firm*—Nields, Lemack & Dingman

[57] ABSTRACT

A charge exchange cell for ion implanters employing a tandem accelerator has a hollow-wall construction with a heating element inserted inside the hollow wall.

11 Claims, 5 Drawing Sheets

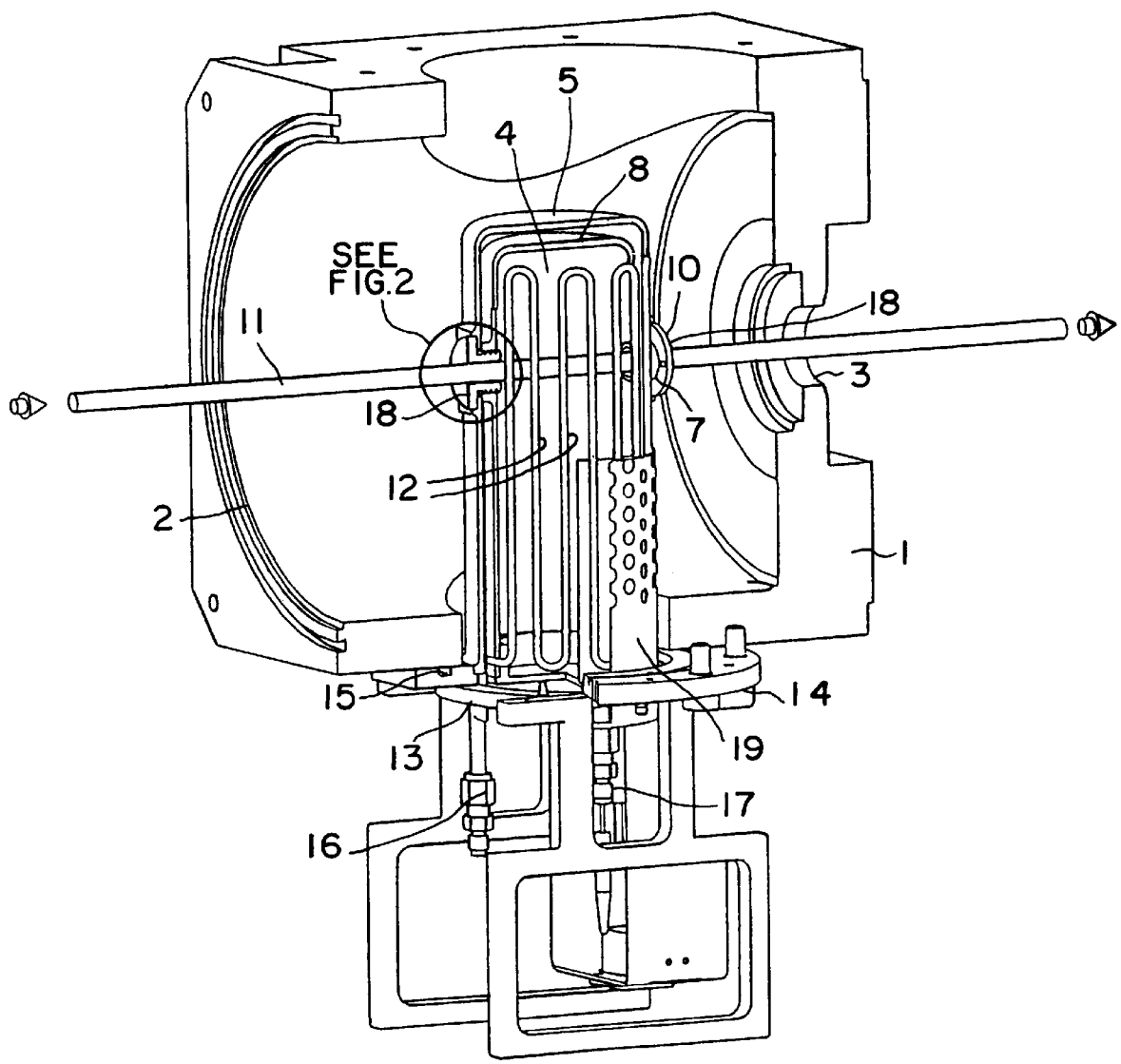
FIG. I
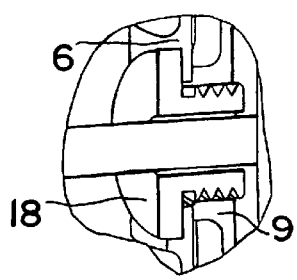
FIG. 2

CHARGE EXCHANGE CELL

BACKGROUND OF THE INVENTION

1. Field of the Invention

The present invention relates to charge-exchange cells for use in ion implanters employing a tandem accelerator.

2. Description of the Prior Art

Charge-exchange cells are used in ion implanters employing a tandem accelerator. Such implanters are commonly used in high energy, high current, and medium current semiconductor applications. The state-of-the-art design of the charge-exchange cell has solid walls, with the result that heating and cooling are time-consuming. Heating of the cell is accomplished with a heat cartridge which is inserted in a tube welded on one side of the cell. Heat must conduct from the tube through the walls to the rest of the cell. Therefore the walls are thick, in order to enhance the conductivity, but at the cost of having large thermal mass. Cooling is accomplished by blowing air through a tube which is welded to the cell body. The low amount of surface area of the tube, combined with the large thermal mass of the cell, causes the time for cooling to be high. The cell requires about 45 minutes to heat up to 400° C. and about an hour to cool down to 100° C.

A tandem accelerator employs a charge-exchange device to produce a negative ion beam for injection into the accelerator. In the past, many studies have been conducted on several types of charge-exchange cells utilizing gas, metal vapor, or metal-foil targets. Metal vapors commonly used as targets include Mg, Li, K and Na. Typically, a metal-vapor cell consists of a target chamber, beam apertures, a reservoir, and a temperature-control system, as shown for example in U.S. Pat. No. 4,712,012 to Naylor. Of critical importance are the temperature uniformity and thermal stability of the cell, since the latter governs the stability of the negative-beam output.

SUMMARY OF THE INVENTION

The new charge-exchange cell of the present invention is based on a hollow wall. The hollow wall allows a heating element to be inserted inside the wall. This provides faster and more uniform heating around the cell. Cooling can be achieved by blowing air directly into the hollow wall. The large surface area inside the wall allows for faster cooling. The relatively cool outer wall also acts as a heat shield between the hot inner wall and the heat-sensitive vacuum equipment surrounding the cell.

A preferred embodiment of the present invention comprehends a metal-vapor charge-exchange cell having a highly regulated, as well as uniform, temperature.

The present invention provides overall optimization of the design with respect to "thermal economy": i.e., fast heatup/cooldown times; also, only about 200 watts are required to maintain 420° C.

BRIEF DESCRIPTION OF THE DRAWINGS

The invention may best be understood from the following detailed description thereof, having reference to the accompanying drawings, in which:

FIG. 1 is a view in perspective, partly broken away, showing a charge exchange cell constructed in accordance with the present invention;

FIG. 2 is a detail of the apparatus of FIG. 1;

DESCRIPTION OF THE PREFERRED EMBODIMENT

Figure 3:
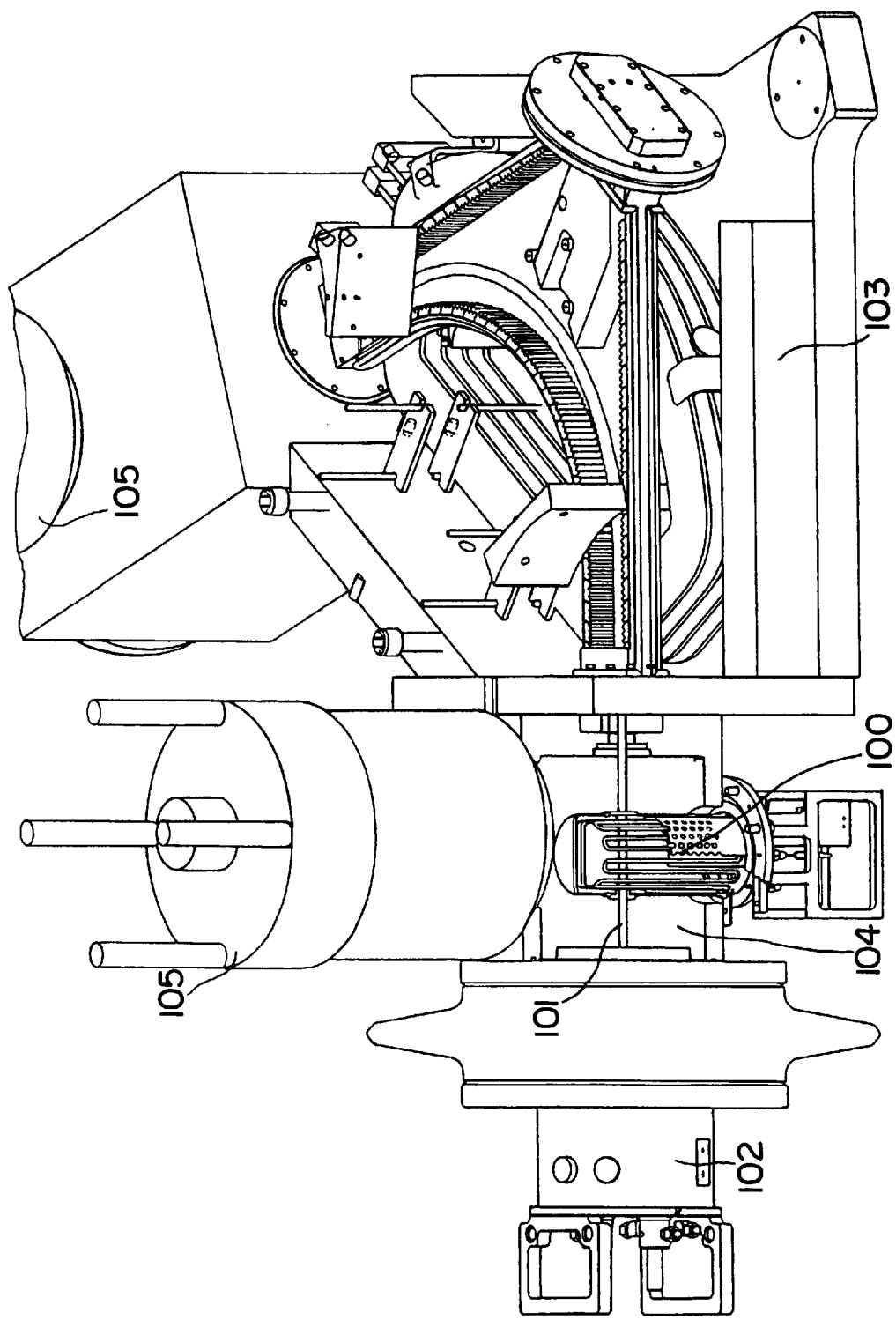
FIG. 3 is a view in perspective, partly broken away, showing the low-energy end of a tandem accelerator having a charge exchange cell constructed in accordance with the present invention.

The design of the charge exchange cell of the invention is a modification of a previous design, such as that disclosed in U.S. Pat. No. 4,980,556 to O'Connor and White.

Referring to the drawings, and first to FIG. 1 thereof, the charge exchange cell of the invention includes a housing 1 having a beam-entrance aperture 2 and a beam-exit aperture 3, a target chamber 4 including an outer wall 5 having a beam-entrance aperture 6 and a beam-exit aperture 7, and an inner wall 8 having a beam-entrance aperture 9 and a beam-exit aperture 10. In operation, an ion beam 11 passes successively through the apertures 2,6,9,10,7 and 3. The beam-entrance aperture 6 of the outer wall 5 is bounded by a graphite annulus 18. A sinuated heating element 12 is supported between the outer wall 5 and the inner wall 8, extending from the floor to the ceiling of the cell and spanning the entire circumference of the cell. The heating element 12 is sinuated vertically so that it may be easily removed. The heating element 12, which may be a Watlow coaxial resistance cable, transfers heat to the inner wall primarily through thermal radiation. Heat transfer may be enhanced by coating the inner wall 8 with a high-emissivity paint. The high emissivity surfaces also reduce the operating temperature, about 1000° C., of the heating element 12. This in turn lengthens the life of the heating element 12. Radiation to the outer wall 5 may be minimized by a shield 19.

The inner wall 8 forms the target chamber and reservoir for the metal-vapor source material. The inner wall 8 is supported solely at its two apertures 9,10 by the outer wall 5 to minimize heat transfer between them, since each wall is maintained at a different temperature. Both wall thickness' are optimized for low thermal mass, high thermal conductivity and castability. Each aperture 6,7,9,10 is protected from the ion beam 11 by a removable graphite annulus 18. The graphite annuli are threaded for easy insertion and removal. They require no separate fasteners, such as machine screws, which would become distorted from direct impingement by the ion beam and which would hamper removal. The target chamber 4 is closed off by a plate cover 13 attached to a flange 14. The flange 14 floats on a sealing o-ring 15 to allow the flange 14 to freely expand thermally. This reduces thermal stress at the wall/flange seam. The double-wall construction of the cell allows cooling air to be blown into the wall via an air cooling line inlet 16 to provide uniform cooling.

FIG. 3 shows the relationship of the charge exchange cell 100 of the invention to the rest of the tandem accelerator.

Thus, the ion beam 101 enters the charge exchange cell 100 from a positive ion source 102 and exits from the charge exchange cell 100 into an analyzer magnet assembly 103. Vacuum is maintained within the charge exchange chamber 104 by means of a turbo pump 105, which is the heat sensitive vacuum equipment referred to hereinabove as being protected by the heat shield provided by the relatively cool outer wall 5 to which radiation is minimized by the shield 19.

For purposes of comparison with the aforementioned U.S. Pat. No. 4,980,556, it may be noted that the charge exchange cell 100 of the instant specification corresponds to the charge exchange canal 4 (FIG. 1) and the charge exchange system 40 (FIG. 3) of U.S. Pat. No. 4,980,556; and the positive ion source 102 of the instant specification corresponds to the ion source 1 of U.S. Pat. No. 4,980,556. For purposes of comparison with U.S. Pat. No. 4,712,012, the charge exchange cell 100 of the instant specification corresponds to the lithium canal 15 of U.S. Pat. No. 4,712,012. The positive ion source 102 of the instant specification corresponds to the positive ion source 10 of U.S. Pat. No. 4,712,012, which in the non-closely-coupled prior art construction of that patent is spaced from the lithium canal 15 by a permanent magnet assembly 13. The analyzer magnet assembly 103 of the instant specification corresponds to the permanent magnet assembly 16 of U.S. Pat. No. 4,712,012.

The closed-loop temperature-control system includes a K-type thermocouple 17, a controller (not shown), and the 2000 watt heating element 12. The controller utilizes a proportional-integral-derivative (PID) algorithm. The pulse width during heating and maintaining temperature is an important factor in determining the life of the heating element 12. Under the present conditions and with a pulse width of 0.1 seconds, the element life is about 6 months running continuously.

The PID method is an on/off type; the heating element is either completely on or completely off. The amount of heat delivered to the cell is controlled by varying the amount of time that the element is on or off. The amount of time that the element is on is called the pulse width. The pulse width is determined by the electronic controller. The controller determines the pulse width by (1) looking at the temperature of the cell (via the thermocouple), (2) comparing it to the desired temperature of the cell (setpoint), (3) calculating the pulse width required to best achieve the setpoint, and (4) delivering the pulse width to the heating element. The controller cycles through this algorithm continuously in order to achieve and maintain the desired cell temperature. The pulse width should be small for two reasons. Firstly, a smaller pulse width results in better temperature control of the cell because there is less over/undershoot. More specifically, the cell temperature is maintained to ±2° C.; in a preferred embodiment a cell temperature of 420° C. is maintained with a precision of ±2° C. Secondly, a smaller pulse width causes less temperature extremes in the element itself, resulting in greater element life.

Figure 4:
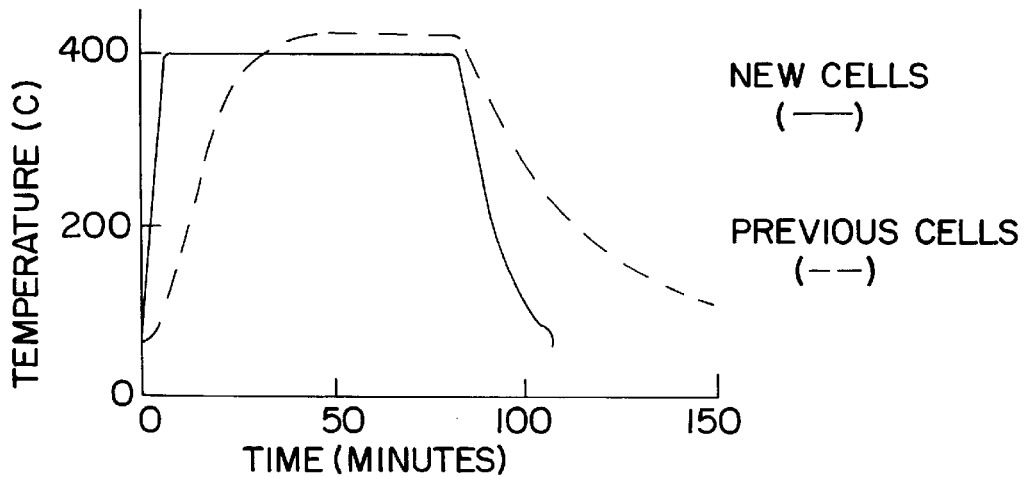
FIG. 4 is a graph of temperature as a function of time, showing a comparison of new and previous cells.
Figure 6:
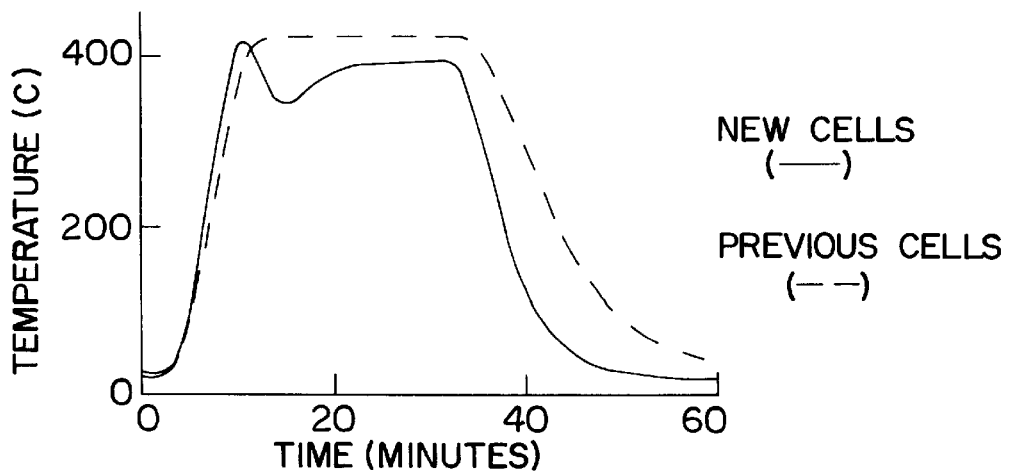
FIG. 6 is a graph of temperature as a function of time, showing a comparison of temperature at the base and at the aperture of the new cell.

The charge exchange cell reaches a temperature of 400° C. in about 6 minutes, as can be seen in FIG. 4, wherein the unbroken line shows the temperature of the cell of the invention and the broken line shows the temperature of previous cells. This time of 6 minutes may be contrasted to the heat-up time of about 45 minutes for the previous cell. This reduction of heat-up time results from the doubling of heater power and from the minimization of thermal mass in the new design. In other tests, the minimal thermal mass of the design of the apparatus of the invention allowed a heatup time of about 12 minutes from 25° C. to 420° C. FIG. 6 is a graph of temperature (° C.) vs. time (minutes) wherein the solid line shows the temperature at the base and the broken line shows the temperature at the aperture of the cell of the invention. Referring now to FIG. 4, the aperture temperature actually runs hotter than the base temperature during the first five minutes of heat-up. The aperture temperature finally settles out after about 15 minutes. Overshoot of the cell temperature relative to the set point is minimized by choosing the appropriate tuning parameters in the controller. These parameters also govern the magnitude of oscillation of the cell temperature around the set point during temperature maintenance mode. The set point of the cell can be set as high as 700° C. without harming the cell or any of its components. This is a result of the fact that the heating element of the invention can itself reach sufficiently high temperatures and, with other components of the apparatus of the invention, allows the target region of such apparatus to reach 700° C. in temperature.

Figure 5:
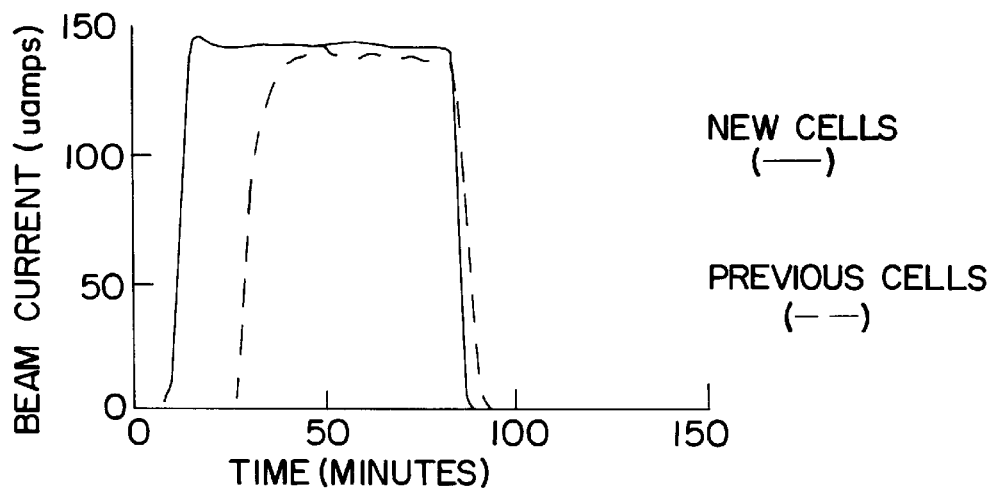
FIG. 5 is a graph of beam current as a function of time, showing a comparison of negative-beam output of new and previous cells.

The level of negative beam current being generated by the cell is presented in FIG. 5, wherein the solid line shows the negative-beam output of the cell of the invention and the broken line shows that of previous cells. The beam current lags the cell temperature by about 7 minutes. This time lag results from the thermal lag between the cell temperature and the actual temperature of Mg or other material inside the chamber. If the Mg is in the form of pellets, there is considerable thermal contact resistance between the pellets, resulting in the time lag. The overall thermal contact resistance across the chamber might be decreased by using pellets of greater size, since there would be less contact points in the heat path. The sublimation rate of Mg pellets into vapor increases with temperature, of course, so that the ion exchange rate inside the chamber lags the cell temperature during heatup. The ion exchange through the cell comes to equilibrium in about 15 minutes after initial powerup. There is a similar lag in the previous cell design.

Figure 7:
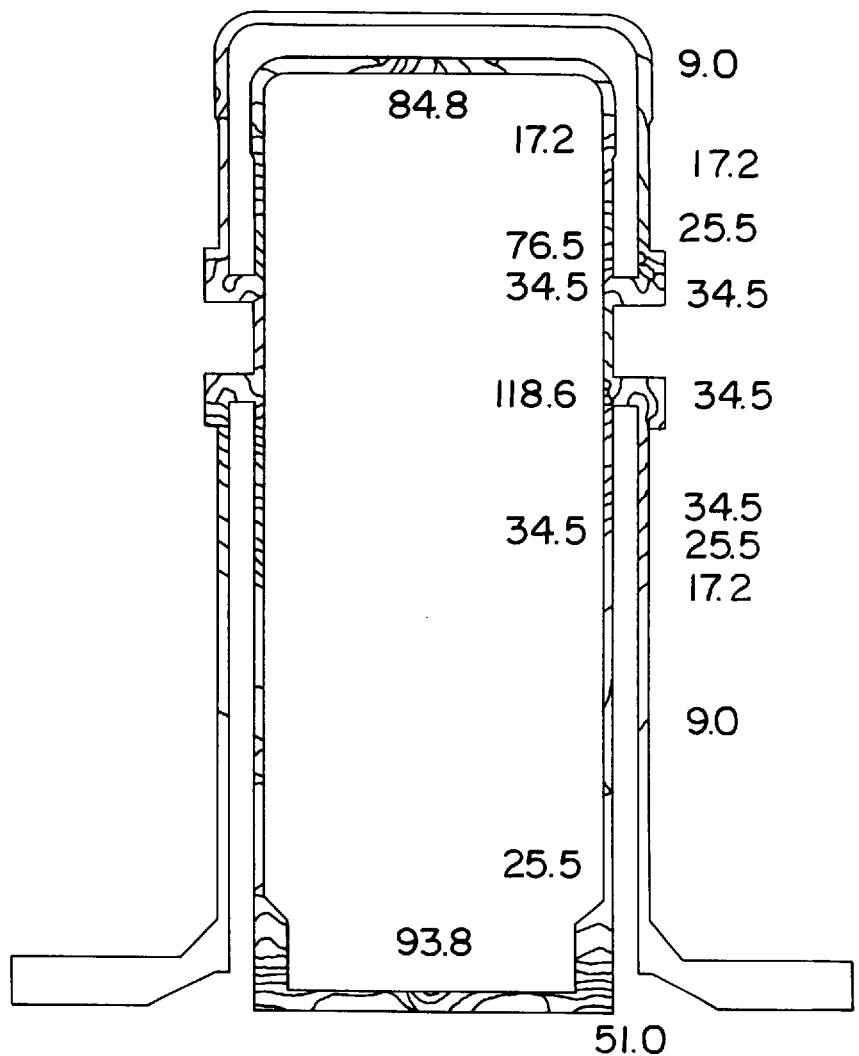
FIG. 7 is a diagrammatic sketch showing calculated thermal stress (MPa) profile in the charge exchange cell of the invention during heatup at t=36 seconds.

FIG. 7 is a calculated thermal stress (MPa) profile in the charge exchange cell of the invention during heatup at t=36 seconds. NISA finite-element analysis (FEA) predicts maximum thermal stresses of about 118.6 MPa (17.2 Kpsi) in the cell during heatup, as shown in FIG. 7. (The stress unit of MPa is shorthand for mega, or million, pascals.) This number can be compared to the fatigue strength of the cell material, 17-4PH stainless steel, which is 621 MPa (90 Kpsi). (The 17-4PH stainless steel refers to the grade of steel. The significance of the grade is the elemental composition and therefore the properties of the steel. This particular grade was selected because of its high fatigue strength and also its good castability.) Thus the cell has a theoretically infinite life under these operating conditions. Thermal stress depends on the temperature distribution through the cell, which itself changes during heatup and cooldown. The maximum stress occurs at about 36 seconds after initial powerup. This stress is located in the inner wall just below the aperture.

Figure 8:
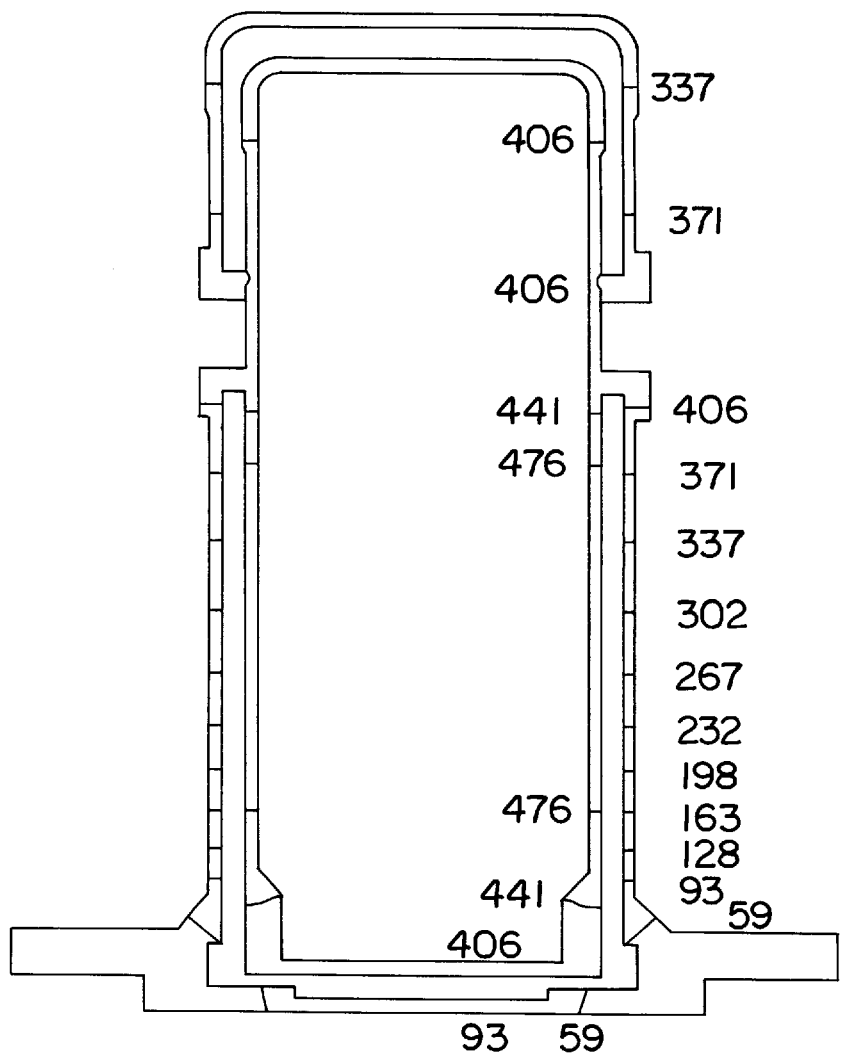
FIG. 8 is a diagrammatic sketch showing calculated temperature profile of the cell of the invention at steady-state conditions (°C.).

FEA of the cell of the invention predicts somewhat cooler temperatures around the apertures when no beam is present, as shown in FIG. 8. The cooler outer wall acts as a heat sink from the chamber at the locations of the apertures. The cooler aperture is verified in FIG. 6. The temperature differential between the aperture and the base at steady state is about 26° C. with no beam present. There is a relatively hot region midway between the aperture and the floor of the chamber. There is a similar hot region on the previous design. The floor and ceiling are the coolest areas of the chamber in the design of the invention, but these areas still run hot enough to prevent Mg buildup. The length of outer wall between the aperture and the flange serves as a thermal barrier to keep the flange relatively cool. The flange temperature runs at about 60° C.

The charge exchange rate of the ion beam is governed by the density of the Mg vapor inside the chamber, and so the beam stability is highly correlated to the stability of the cell temperature, as shown in FIGS. 4 and 5. In order to achieve maximum beam stability, the cell temperature should be adjusted for maximum beam output. Then any fluctuations in temperature cause minimal disturbances to the Mg vapor density. It has been recommended that the charge-exchange target be operated at the lowest possible temperature and that the cell temperature be used to control the negative-ion beam output.

With a cooling-air supply pressure of about 758 KPa (110 psi), the cell cools at a rate of 28° C./minute at 400° C. The time to cool the cell from 400° C. to 100° C. is about 17 minutes, as shown in FIG. 4. In other tests cooling time was 18 minutes from 420° C. to 100° C. as a result of minimal thermal mass. This cooling rate can be contrasted to that of the previous cell design, about 9° C./minute at 400° C. The cooldown time from 431° C. to 100° C. is about 70 minutes. FE analysis predicts a maximum thermal stress of about 117 MPa (17 kpsi) during cooling.

Having thus described the principles of the invention, together with illustrative embodiments thereof, it is to be understood that although specific terms are employed, they are used in a generic and descriptive sense, and not for purposes of limitation, the scope of the invention being set forth in the following claims.

We claim:

1. Apparatus for generating negative ions for injection into tandem accelerators such as those used in ion implantation, comprising in combination a positive ion source, a housing having a beam-entrance aperture and a beam-exit aperture, a target chamber having an outer cylindrical wall and an inner cylindrical wall forming a tubular space and having minimal thermal mass, said walls having beam-entrance apertures and beam-exit apertures, said target chamber being mounted within said housing so that said apertures in said walls are aligned with said apertures in said housing for passage of an ion beam therethrough, a reservoir of vaporizable metal within said target chamber, said metal being of a type capable of converting positive ions from said positive ion source to negative ions by charge exchange, a temperature-control system including a heating element mounted within said tubular space and adapted to vaporize said metal, said target chamber having an inlet adapted to admit cooling air into said tubular space, said minimal thermal mass allowing a heatup time of about 12 minutes from 25° C. to 420° C. and a cooling time of 18 minutes from 420° C. to 100° C., and means for directing a beam of positive ions from said positive ion source sequentially through said apertures.

2. Apparatus according to claim 1, wherein said heating element has minimal thermal mass and, with other components of the apparatus of claim 1, allows the target region of such apparatus to reach 700° C. in temperature.

3. Apparatus according to claim 1, wherein said heating element is sinuated and occupies a substantial portion of said tubular space.

4. Apparatus according to claim 1, wherein said outer wall acts as a heat shield between said hot inner wall and thermally sensitive vacuum equipment outside said target chamber.

5. Apparatus according to claim 1, wherein at least one of said apertures is bounded by a removable annulus made of consumable graphite.

6. Apparatus according to claim 5, wherein said at least one aperture is threaded so as to require no external fastening.

7. Apparatus according to claim 1, including a shield adapted to reduce radiation from said heating element to said outer wall.

8. Apparatus according to claim 1, wherein said inner wall is coated with a high-emissivity paint.

9. Apparatus according to claim 1, wherein said inner wall is supported solely at its said apertures by said outer wall to reduce heat transfer between them.

10. Apparatus according to claim 1, wherein said temperature-control system includes a heating element which alternates between an "on" state and an "off" state, wherein the amount of time that the element is in each of said "on" states is called the pulse width, and wherein said pulse width during heating and maintaining temperature is of the order of 0.1 seconds.

11. Apparatus for generating negative ions for injection into tandem accelerators such as those used in ion implantation, comprising in combination a positive ion source, a housing having a beam-entrance aperture and a beam-exit aperture, a target chamber having an outer cylindrical wall and an inner cylindrical wall forming a tubular space and having minimal thermal mass, said walls having beam-entrance apertures and beam-exit apertures, said target chamber being mounted within said housing so that said apertures in said walls are aligned with said apertures in said housing for passage of an ion beam therethrough, a reservoir of vaporizable metal within said target chamber, said metal being of a type capable of converting positive ions from said positive ion source to negative ions by charge exchange, a temperature-control system including a heating element mounted within said tubular space and adapted to vaporize said metal, said target chamber having an inlet adapted to admit cooling air into said tubular space, said minimal thermal mass allowing a reduction of heatup time to a temperature of 400° C. from 45 minutes to about 6 minutes and a reduction of cooling rate from 28° C./minute at 400° C. to about 9° C./minute at 400° C., and means for directing a beam of positive ions from said positive ion source sequentially through said apertures.

* * * * *